United States Patent [19]
Sharma et al.

[11] Patent Number: 5,910,919
[45] Date of Patent: Jun. 8, 1999

[54] CIRCUITS, SYSTEMS AND METHODS FOR MODIFYING DATA STORED IN A MEMORY USING LOGIC OPERATIONS

[75] Inventors: Sudhir Sharma, Plano; Michael E. Runas, McKinney; Robert M. Nally, Plano, all of Tex.

[73] Assignee: Cirrus Logic, Inc., Fremont, Calif.

[21] Appl. No.: 08/903,390

[22] Filed: Jul. 30, 1997

Related U.S. Application Data

[62] Division of application No. 08/424,653, Apr. 19, 1995, Pat. No. 5,732,024.

[51] Int. Cl.$^6$ ...................................................... G11C 8/00
[52] U.S. Cl. ................................ 365/189.05; 365/230.06
[58] Field of Search ..................... 365/189.05, 230.06, 365/230.08, 196, 149

[56] References Cited

U.S. PATENT DOCUMENTS

| 5,195,056 | 3/1993 | Pinkham | 365/189.05 |
| 5,432,743 | 7/1995 | Kusakari | 365/196 |

FOREIGN PATENT DOCUMENTS

| 02 09 050 | 7/1985 | European Pat. Off. . |
| 56082928 | 12/1979 | Japan . |
| 5-298178 | 4/1993 | Japan . |
| 222567 | 12/1998 | United Kingdom . |

OTHER PUBLICATIONS

"Patent Abstracts of Japan" vol. 18, No. 264, p. 1740 on May 19, 1994. Abstract JP A06036555

"Patent Abstracts of Japan" vol. 18, No. 333, p. 1759 on Jun. 23, 1994 Abstract No. JP A06076565.

*Primary Examiner*—A. Zarabian
*Attorney, Agent, or Firm*—James J. Murphy; Steven A. Shaw

[57] ABSTRACT

A memory system 104 includes an array 200 of memory calls arranged in rows and columns and circuitry 208 for selectively performing logic operations on a bit of data stored in a selected call using a bit of received modifying data and a mode data bit for selecting a logic operation for performance. Circuitry 208 for modifying during an OR logic operation writing bit of the modifying data into the cell when the bit of modifying data is a logic one and maintaining an existing bit stored in call when the bit of modifying data is a logic zero. Memory system 104 further includes circuitry 207, 210 for receiving and latching the mode data and the modifying data through a single port.

6 Claims, 3 Drawing Sheets

CIRCUITS, SYSTEMS AND METHODS FOR MODIFYING DATA STORED IN A MEMORY USING LOGIC OPERATIONS

CROSS REFERENCE TO RELATED APPLICATIONS

This is a division of application Ser. No. 08/424,653, filed Apr. 19, 1995, entitled CIRCUITS, SYSTEMS AND METHODS FOR MODIFYING DATA STORED IN A MEMORY USING LOGIC OPERATIONS by Sudhir Sharma, inventor, U.S. Pat. No. 5,732,024.

TECHNICAL FIELD OF THE INVENTION

The present invention relates in general to electronic circuits and in particular to circuits, systems and methods for modifying data stored in a memory using logic operations.

BACKGROUND OF THE INVENTION

A typical processing system with video/graphics display capability includes a central processing unit (CPU), a display controller coupled with the CPU by a system bus, a system memory also coupled to the system bus, a frame buffer coupled to the display controller by a local bus, peripheral circuitry (e.g., clock drivers and signal converters), display driver circuitry, and a display unit. The CPU generally provides overall system control and, in response to user commands and program instructions retrieved from the system memory, controls the contents of graphics images to be displayed on the display unit. The display controller, which may for example be a video graphics architecture (VGA) controller, generally interfaces the CPU and the display driver circuitry, exchanges graphics and/or video data with the frame buffer during data processing and display refresh operations, controls frame buffer memory operations, and performs additional processing on the subject graphics or video data, such as color expansion. The display driver circuitry converts digital data received from the display controller into the analog levels required by the display unit to generate graphics/video display images. The display unit may be any type of device which presents images to the user conveying the information represented by the graphics/video data being processed.

The frame buffer, which is typically constructed from dynamic random access memory devices (DRAMs), stores words of graphics or video data defining the color/grayshade of each pixel of an entire display frame during processing operations such as filtering or drawing images. During display refresh, this "pixel data" is retrieved out of the frame buffer by the display controller pixel by pixel as the corresponding pixels on the display screen are refreshed. Thus, the size of the frame buffer directly corresponds to the number of pixels in each display frame and the number of bits (Bytes) in each word used to define each pixel. The size and performance of frame buffer is dictated by a number of factors such as, the number of monitor pixels, the monitor DOT clock rate, display refresh, data read/write frequency, and memory bandwidth, to name only a few.

It often becomes necessary to operate on selected pixel data within the frame buffer using logic operations in order to effect changes on the display screen. For example, when a cursor crosses a window boundary or when a window is "clicked-on", it may be desirable to change the color of the window for emphasis. Another example is in the implementation of drawing tools which allow the user to control the opacity of a given display window. In presently available systems, a selected byte of data is typically read out of a given location in the frame buffer, modified using a given logic operation and appropriate modifying data, and then written back as modified into the frame buffer. These operations are typically accomplished using either two back-to-back RAS accesses or a read-modify-write cycle. In the first case, two RAS/CAS cycles are required, one to read the unmodified data out of memory and one to write the modified data back into memory. In the second case, one extended RAS/CAS cycle is used during which the data is read out, modified, and written back. In each case, a performance (time) penalty is paid with each byte of data modified. If a large number of bytes are being modified the impact on system performance can be substantial.

Thus, the need has arisen for apparatus, systems and methods for performing logic operations on data stored in a memory. In particular, the need has arisen for apparatus, systems and methods which minimize the performance penalties paid by the presently available systems, especially those systems which require both the performance of multiple read and write cycles, during the process of performing a logic operation on selected bytes of data. Further, such apparatus, systems and methods should be particularly applicable to the performance of logic operations on pixel data being stored in a frame buffer.

SUMMARY OF THE INVENTION

According to the principles of the present invention, selected logic operations can be performed on data stored within selected locations in a memory without multiple or extended RAS/CAS cycles. The principles of the present invention generally take advantage of the fact that during AND and OR operations a bit of data being operated on either remains the same or is replaced with a corresponding bit of modifying data, depending on the state of that bit of modifying data.

According to a first embodiment of the present invention, a memory system is provided which includes an array of memory cells arranged in rows and columns. Circuitry is provided for selectively performing logic operations on a bit of data stored in a selected one of the memory cells using a bit of received modifying data, the circuitry for performing logic operations during an AND operation writing the bit of modifying data into the selected cell when the bit of modifying data is a logic zero and maintaining an existing bit stored in the selected cell when the bit of modifying data is a logic one.

According to a second embodiment of the present invention, a memory system is provided which includes an array of memory cells arranged in rows and columns. Circuitry is provided for selectively performing logic operations on a bit of data stored in a selected one of the memory cells using a bit of received modifying data, the circuitry for modifying during an OR logic operation writing the bit of modifying data into the selected cell when the bit of modifying data is a logic one and maintaining an existing bit stored in the selected cell when the bit of modifying data is a logic zero.

According to a third embodiment of the present invention, a memory system is provided including an array of rows and columns of memory cells. Circuitry is provided for accessing a selected location in the array, including a row decoder coupled to each of the rows, sense amplifiers coupled to each of the columns, and a column decoder coupled to the sense amplifiers. Circuitry is included for decoding a mode select word defining a logic operation to be performed into at least one mode control signal. Further, a data latch is provided for holding modifying data to be used to modify data in an accessed location in the array during a selected logic operation. Write buffer circuitry is coupled to the column decoder for selectively writing data into the accessed location. Finally, circuitry is provided for selectively enabling the write buffer circuitry to write data into cells of the accessed location in the array in response to the mode control signals, a received external write enable signal, and a received external write enable-signal and a received word of modifying data held in said latch. During an AND operation, the circuitry for selectively enabling is operable to enable the write buffer to write a bit of the modifying data into a corresponding cell in the accessed location when the bit of modifying data is a logic zero. During an OR operation, the circuitry for selectively enabling is operable to enable the write buffer circuitry to write a bit of the modifying data into a corresponding cell in the accessed location when the bit of modifying data is a logic one.

The principles of the present invention are also embodied in a processing system which includes a controller and an array of rows and columns of memory cells. A row decoder is coupled to the rows, the row decoder selecting a given row for access in response to a row address latched into an associated address latch by a row address strobe generated by the controller. A plurality of sense amplifiers are coupled to the columns of cells for reading and writing data into the cells of the selected row. A column decoder is coupled to the sense amplifiers, the column decoder selecting ones of the cells along the selected row for access in response to a column address latched into the address latch by a column address strobe generated by the controller. A first data latch is provided for storing a mode select word received from the controller. A mode decoder is included for decoding the mode select word held in the first latch into an AND mode control signal and an OR mode control signal. A second latch is provided for holding modifying data to be used to modify data in the accessed location in the array during a modify operation. A plurality of write buffers are coupled to the column decoder for selectively writing data into the accessed cells along the selected row in the array. A plurality of control circuits are provided, each coupled to a corresponding one of the write buffers for selectively enabling the corresponding write buffer to write data into a corresponding accessed cell in response to the mode control signals, an external write enable signal generated by the controller, and a corresponding bit of modifying data held in the second latch. Each of the control circuits is operable during an AND operation to enable the corresponding write buffer to write a bit of modifying data into the corresponding cell in the accessed location when the bit of modifying data is a logic zero. Each control circuit is further operable during an OR operation to enable the corresponding write buffer to write a bit of modifying data into the corresponding cell in the accessed location when the bit of modifying data is a logic zero.

The principles of the present invention are also embodied in sensing circuitry. According to one embodiment, a sense amplifier is provided for latching a bit of data on a true bit line and a complementary bit of data on a complementary bit line. Circuitry is provided for performing Boolean operations on a bit of data latched into the sense amplifier in response to a bit of modifying data, the circuitry for performing Boolean operations operable during an AND operation to pull down the true bit line when the bit of modifying data is a logic zero.

According to another embodiment, a memory system is provided which includes an array of rows and columns of memory cells. A row decoder is coupled to the rows for selecting a row for access in response to a row address. A plurality of sense amplifiers are coupled to the columns of cells for reading and writing data into the cells of a selected row, each of the sense amplifiers latching a bit of data on a true bit line and a complementary bit of data on a complementary bit line. A column decoder is coupled to the sense amplifiers for selecting ones of the cells along the selected row for access in response to a column address A plurality of data modification circuits are provided each coupled to a corresponding one of the sense amplifiers for performing a selected logic operation on data latched into the corresponding sense amplifier in response to a bit of modifying data. Each modification circuit is operable during an AND operation to pull down the true bit line when the bit of modifying data is a logic zero and during an OR operation pull up the true bit line when the bit of modifying data is a logic one.

Finally, the principles of the present invention are also embodied in methods for performing logic operations on data stored within a memory. According to one embodiment, a memory cell in a memory containing data to be modified is addressed A bit of modifying data is received and an AND operation is performed during which the bit of modifying data is written into the address cell if the bit of modifying data is a logic zero and the data already stored in the address cell is maintained when the bit of modified data is a logic one. In a second method according to the principles of the present invention, at least one memory cell in a memory containing data to be modified is addressed. A bit of modifying data is received and an OR operation is performed in which the bit of modifying data is written into the address cell when the bit of modifying data is a logic one and the bit of data already stored in the address cell is maintained when the bit of modifying data is a logic zero.

Apparatus, systems and methods embodying the principles of the present invention have substantial advantages over the prior art. Specifically, the principles of the present invention allow for the minimization of the performance penalties paid by presently available systems, circuits and methods for modifying bits of data within a memory device, especially those systems which require the performance of multiple read and write cycles. Further, the principles of the present invention are particularly useful for the performance of logic operations on pixel data being stored in a frame buffer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
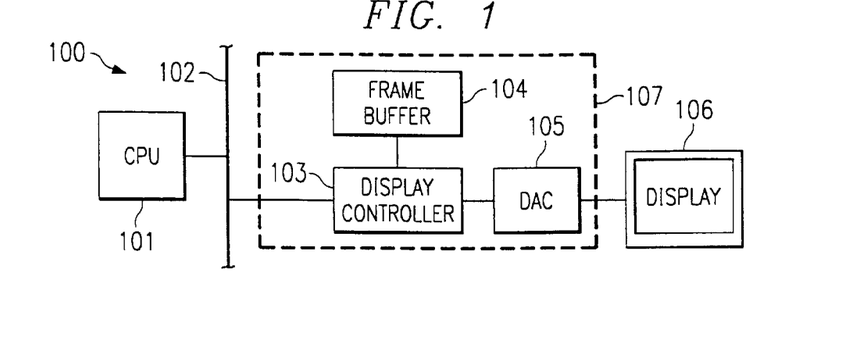
FIG. 1 is a functional block diagram of a video/graphics processing system embodying the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. In a preferred embodiment of the present invention, display controller 103 and frame buffer 104 and DAC 105 are fabricated together on a single integrated circuit chip 107.

CPU 101 controls the overall operation of system 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

In the illustrated embodiment, controller 103 is a display controller, such as a VGA controller, which among other things, controls the exchange of graphics and/or video data with frame buffer 103, controls memory refresh, and performs data processing functions such as color expansion A display controller is the "master" for the specific application of display and thus frees up CPU 101 to perform computational tasks. Moreover, the architecture of a display controller optimizes it to perform graphics and video functions in a manner for superior to that of a general purpose microprocessor. Controller 103 may also include a color palette, cursor generation hardware, and/or video to graphics conversion circuitry, to name a few options.

Frame buffer 104 is preferably a dynamic random access memory (DRAM) which includes an array of rows and columns of DRAM cells and associated address and control circuitry such as row and column decoders, read and write buffers, and sense amplifiers. Frame buffer 104 will be discussed in further detail below Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device which directly accepts digital data It should also be noted that in alternate embodiments, "display" 106 may be another type of output device such as a laser printer or similar document view/print appliances.

According to the principles of the present invention, selected logic operations can be performed on words of data within selected locations within frame buffer 104. Specifically, these principles take advantage of the fact that during AND and OR operations a bit of data in memory being operated on either remains the same or is replaced with the corresponding bit of the modifying data provided by controller 103, depending on the state of the bit of modifying data. This feature is illustrated in Table 1:

| OPERANDS | | RESULTS | |
|---|---|---|---|
| CELL DATA | MODIFYING DATA | AND | OR |
| 0 | 0 | 0 | 0 |
| 0 | 1 | 0 | 1 |
| 1 | 0 | 0 | 1 |
| 1 | 1 | 1 | 1 |

As can be seen in Table 1, during an AND operations the resulting data remains the same as that already stored in the selected memory cell for the input conditions set forth in the second and forth rows (i.e. the modifying data equals a logic 1). In this case, a read (refresh) of the data within the given cell operation is all that is required to perform the "modification". This can be accomplished with a single RAS/CAS cycle with the write enable signal inactive. During an AND operation, with the input conditions set forth in the first and third rows (i.e. the modifying data is a logic 0), the resulting data is the same as the modifying data. In this case, all that is required to modify the data in the memory cell is to directly write the modifying data into the memory cell. This also can be accomplished with a single RAS/CAS cycle, only this time the write enable signal is active. In each case, there is no need to perform both a read and a write operation to modify the data in the memory cell. Further, as will be discussed further below in conjunction with FIG. 2, there is also no need to actually perform the AND operation; data is either simply refreshed by a read operation or written directly in as a function of the state of the corresponding bit of modifying data.

For an OR operation, the resulting data remains the same as that already stored in the selected memory cell for the input conditions set forth in the first and third rows (i.e. the modifying data equals a logic 0). Again, all that is required to "modify" the data in the cell is to perform a single RAS/CAS cycle read operation. For the input conditions set forth in the second and fourth rows (i.e. the modifying data equals a logic 1), the resulting data is the same as the modifying data and therefore all that is required is for the modifying data to be written directly to the selected memory cell using a conventional single RAS/CAS write cycle. As was the case with the AND operation, the performance of an actual OR operation is not required; data is either refreshed by a read operation or the modifying data is written directly in as a function of the modifying data.

Similar principles may be followed for the modification of data within given memory cells using NAND and NOR operations. In the case of a NAND operation, the modifying data is inverted (i.e. the complement is taken) and the conditions for an OR operation are applied as discussed immediately above. For a NOR operation, the complement of the modifying data is again taken and the conditions for an AND operation applied as discussed.

Figure 2:
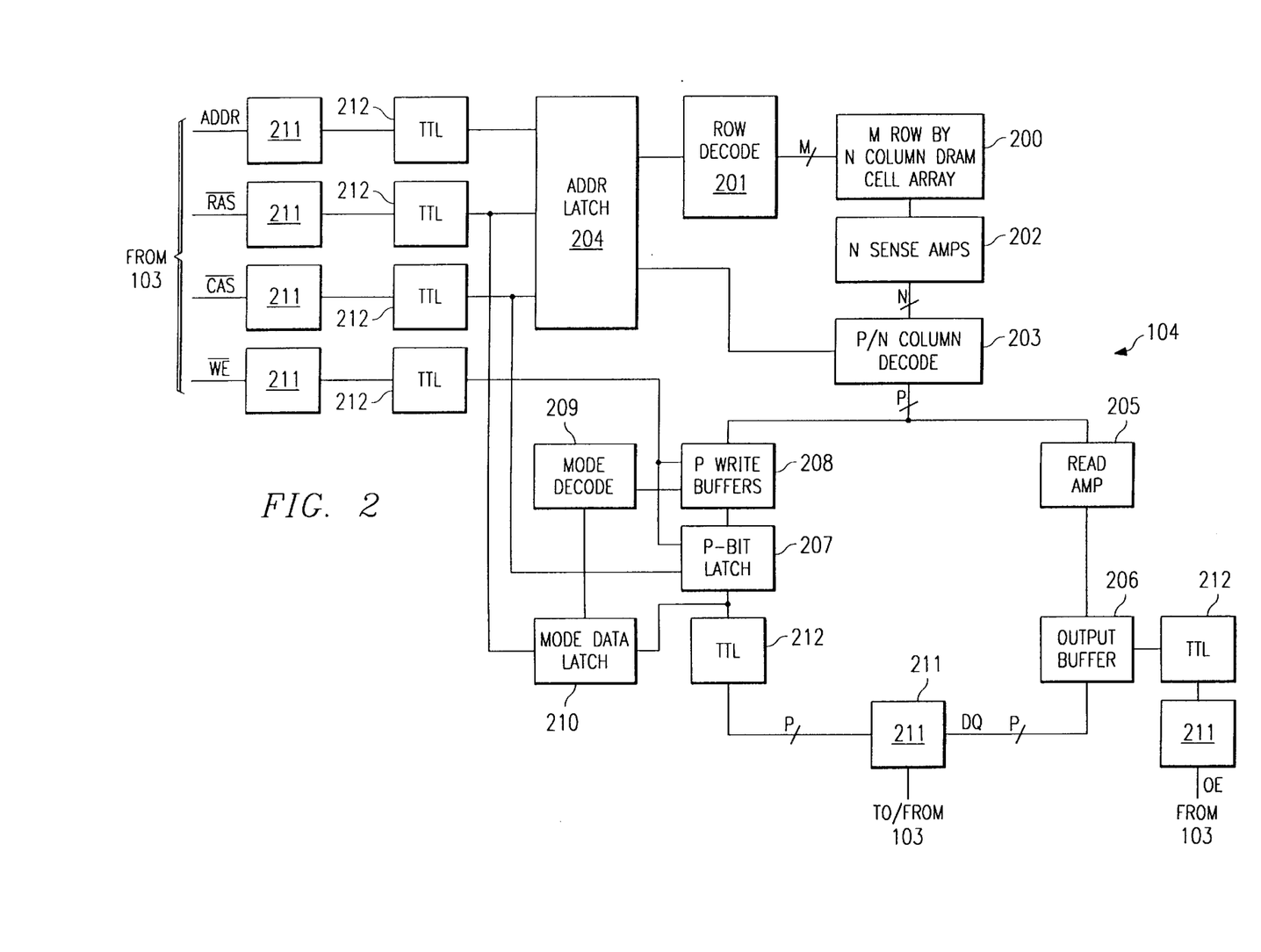
FIG. 2 is a more detailed functional block diagram of the frame buffer of FIG. 1 according to one embodiment of the present invention.

FIG. 2 is a more detailed functional block diagram of frame buffer 104 according to a preferred embodiment of the present invention. A timing diagram describing the operation of the circuitry of FIG. 2 is provided in FIG. 3. Frame buffer 103 includes an array 200 of conventional dynamic random access memory (DRAM) cells arranged in M number of rows and N number of columns. Coupled to array 200 are row decoder circuitry 201, sense amplifiers 202 and column decoder circuitry 203. In the preferred embodiment, N number of sense amplifiers 202, one per each column in array 200, are provided Row decoder circuitry 201 and column decoder circuitry 203 control the access to P-cell storage locations from a selected row of array 200 in a conventional manner in response to row and column addresses latched into address latches 204 by RAS and CAS.

Frame buffer 104 also includes read/write control circuitry embodying the principles of the present invention. Data reads from addressed locations in array 200 are accomplished through read amplifiers 205 and output buffer 206 when the output enable signal is active. The write/modify circuitry includes a first data latch 207 which during a conventional write latches data to be written into array 200 and during a modify latches the modifying data. Writes and modifications are performed through write buffer 208 which includes P number of conventional write buffers for writing into each accessed P-cell location. During modification cycles, mode decoder 209 decodes the mode control data latched into a second data latch 210 to determine if an AND or OR operation (and consequently a NOR or NAND operation if complementary modification data is used) is to take place. In the preferred embodiment, latch 210 receives and holds at least two bits of data which, along with the conventional (external) write enable signal WE, determine if a conventional write or an AND or OR operation has been requested by controller 103.

In embodiments where controller 103 and frame buffer 104 have been fabricated as discrete components, frame buffer 104 also includes data pads 211 and associated TTL drivers 212 for receiving data (DQ), addresses, RAS, CAS, WE and OE signals from the controller chip.

During an AND or NOR operation write buffer 208 writes the modifying data latched into data latch 207 into the addressed memory cell when the modifying data is a logic 0. When the modifying data is a logic 1, no write is performed and instead a read takes place (as is known in the art a read operation refreshes the existing data stored in a given accessed memory cell, whatever the state). During an OR or NAND operation, write buffer 208 writes the modifying data latched to data latch 207 into the addressed memory cell when the modifying data is a logic 1; a read occurs when the modifying data is a logic zero. In each case, the modifying of data is controlled by enabling or disabling write buffer 209.

Figure 4:
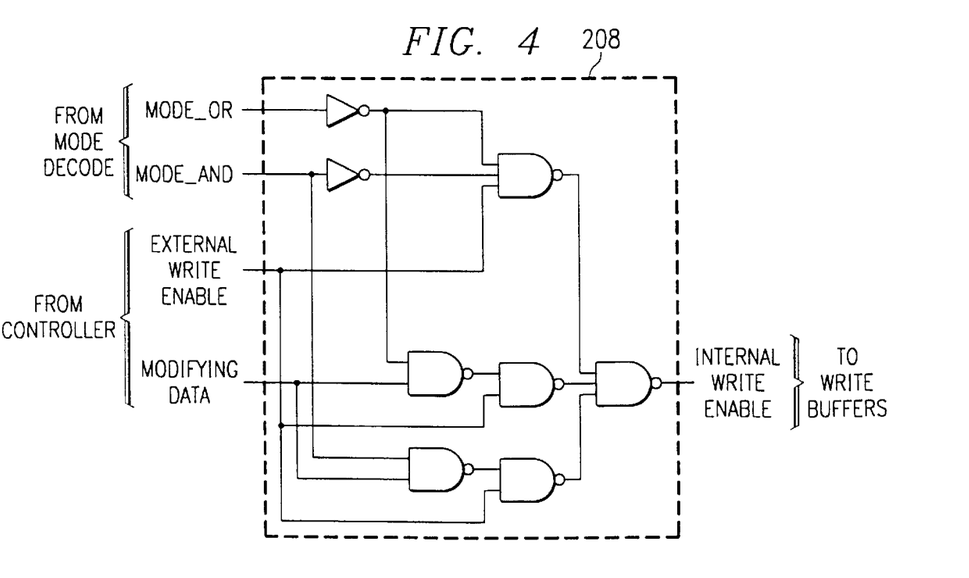
FIG. 4 is an electrical schematic diagram of the internal write enable signal generation circuitry embodied in the circuitry of FIG. 3.

FIG. 4 is a logic diagram of preferred circuitry 400 for enabling or disabling write buffer 209 in order to perform the cell data modifications described above. Preferably, this circuitry is located within write buffer 209 along with the write buffers themselves, although in alternate embodiments circuitry 400 may be disposed elsewhere within the chip. Circuitry 400 generates an "internal write enable" signal which enables/disables write buffer 208 during data modification operations. The internal write enable signal is derived from the conventional write enable signal generated by controller 103 for a conventional write, control signals MODE_AND and MODE_OR, and the modifying data. In the preferred embodiment, circuitry 400 is replicated P number of times such that each of P number of bits accessed in array 200 during a single address cycle can be independently modified. To independently modify P number of bits simultaneously, controller 103 correspondingly generates P number of bits of modifying data which are latched into latch 207.

Control signals MODE_AND and MODE_OR are generated by decoder circuitry 209 from a control word (opcode) latched into data latch 210. Assuming a modification is requested, by controller 103, the external write enable signal is active (i.e. high). When MODE_AND is high and MODE_OR is low, an AND operation is selected and the internal write enable signal is active (high) when the modifying data is a logic 0. When bit MODE_AND is low and bit MODE_OR is high, an OR operation is selected and the internal write enable signal is active (high) when the modifying data is a logic 1. For a conventional write, MODE_AND and MODE_OR are inactive (low) such that the internal write enable signal simply tracks the external write enable signal.

In the case of a NAND operation, the complement of the modifying data is taken and the OR mode is selected. In the case of a NOR operation, the complement of the modifying data is taken and the AND mode is applied. It should be noted that most controllers, such as controller 103, advantageously simultaneously generate complementary data for use in other operations.

Figure 3:
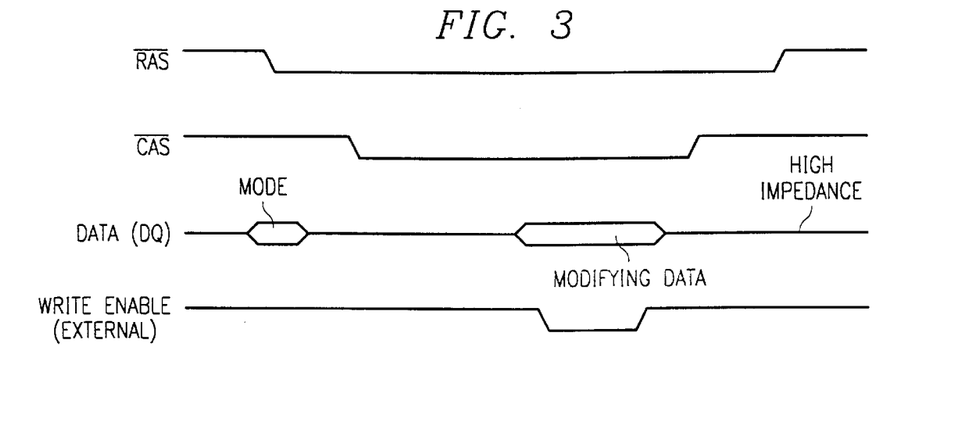
FIG. 3 is a timing diagram illustrating the operation of the circuitry of FIG. 2 during a modify operation.

The timing diagram of FIG. 3 illustrates the timing of a given modifying operation. On the falling edge of the row address strobe (RAS), the mode select data is latched into data latch 201. The falling edge of RAS also latches the row address for the selected location in array 200 into address latch 204. The column portion of the address is latched into address latch 204 on the falling edge of the column address strobe (CAS). When the column address strobe (CAS) and the external enable signal both go low, the modifying data is latched into data latch 207. The data within data latch 210 is decoded by mode decoder 209 and presented as MODE_AND and MODE_OR to the circuitry shown in FIG. 4, as is the modifying data within data latch 207 and the external write enable signal. The modification of the addressed cell or cells (depending on the number of cells P in each address location) proceeds as above.

Figure 5:
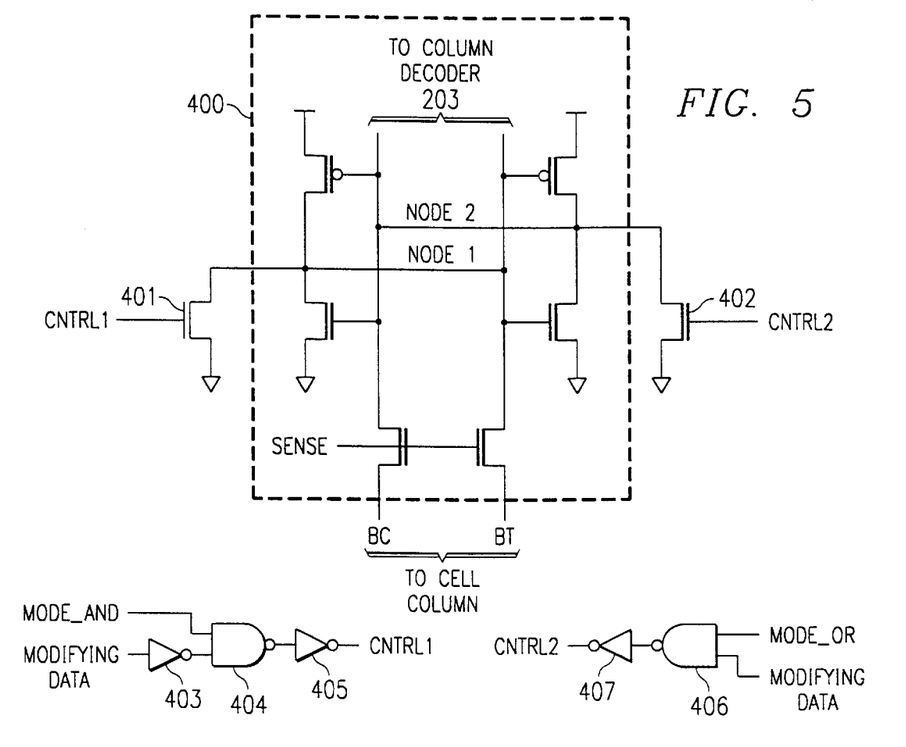
FIG. 5 is an electrical schematic diagram of a sense amplifier according to the principles of the present invention.

FIG. 5 depicts an alternate embodiment of the principles of the present invention. For an AND operations this circuit takes advantage of the fact that if the modifying data is a logic 1, then the data in each memory cell stays the same and if the modifying data is a logic 0, the data in each memory cell is always a logic 0. For an OR operation, this circuit takes advantage of the fact that if the modifying data is a logic 1 the data in each cell will always be logic 1 and if the modifying data is a logic 0, the data in each cell remains the same.

In FIG. 5, a basic latching type sense amplifier 400 is depicted for reference It should be recognized that the principles of the present invention also apply to many other types of latching sense amplifiers known in the art. Two additional transistors 401 and 402 are provided for directly controlling the voltage at nodes 1 and 2 is response to control signals CNTRL1 and CNTRL2 respectively. Control signal CNTRL1 is generated from MODE_AND and the modifying data by inverter 403, NAND gate 404 and inverter 405. Control signal CNTRL2 is generated from MODE_OR and the modifying data by NAND gate 406 and inverter 407. In a typically application, all the sense amplifiers 202 would be controlled as shown in FIG. 5 such that an entire row of cells in array 200 would be modified at one time (i.e. each sense amplifier is associated with a pair of controlling transistors 401 and 402, although only one set of control gates 403–407 are required)

Figure 6:
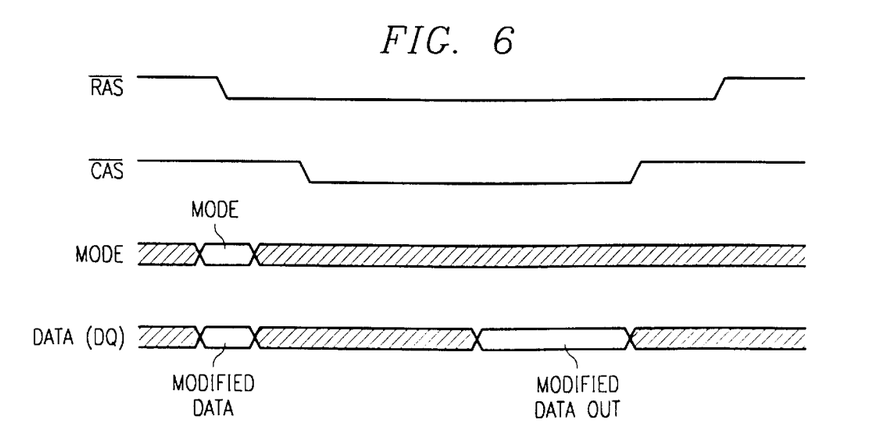
FIG. 6 is a timing diagram illustrating the operation of the sense amplifier of FIG. 5 during a modify operation.

The timing for logic operations using the embodiment of FIG. 5 are shown in FIG. 6. With the falling edge of RAS, a mode select word is latched into latch 210. At the same time, a bit of modifying data is latched into latch 207. After some circuit delay, the modification, discussed further below, is effected. The modified data may then be read out if desired when CAS goes low (in this case, CAS operates as an enable signal allowing access to the data from the selected columns along the selected row).

During an AND operation, control signal MODE_AND is set high. When the modifying data is a logic 0, control signal CNTRL1 goes high and transistor 401 turns on pulling down the true bitline BT. A logic 0 is thereby written into the corresponding memory cell. When the modifying data is a logic 1, the data latched into sense amplifier 400 remains the same. By taking the complement of the modifying data, a NOR operation can similarly be implemented.

During an OR operation, control signal MODE_OR is set high. When the modifying data is a logic 1, control signal CNTRL2 goes high and transistor 402 turns on pulling down the complementary bitline BC (consequently, the true bitline BT is pulled up) A logic 0 is thereby written into the corresponding memory cell. When the modifying data is a logic 0, the data latched in sense amplifier 400 remains the same. By taking the complement of the modifying data, a NAND operation can similarly be implemented.

Although the present invention and its advantages have been described in detail, it should be understood that various changes, substitutions and alterations can be made herein without departing from the spirit and scope of the invention as defined by the appended claims.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. In a preferred embodiment of the present invention, display controller 103 and frame buffer 104 and DAC 105 are fabricated together on a single integrated circuit chip 107.

CPU 101 controls the overall operation of system 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

In the illustrated embodiment, controller 103 is a display controller, such as a VGA controller, which among other things, controls the exchange of graphics and/or video data with frame buffer 103, controls memory refresh, and performs data processing functions such as color expansion. A display controller is the "master" for the specific application of display and thus frees up CPU 101 to perform computational tasks. Moreover, the architecture of a display controller optimizes it to perform graphics and video functions in a manner for superior to that of a general purpose microprocessor. Controller 103 may also include a color palette, cursor generation hardware, and/or video to graphics conversion circuitry, to name a few options.

Frame buffer 104 is preferably a dynamic random access memory (DRAM) which includes an array of rows and columns of DRAM cells and associated address and control circuitry such as row and column decoders, read and write buffers, and sense amplifiers. Frame buffer 104 will be discussed in further detail below.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device which directly accepts digital data. It should also be noted that in alternate embodiments, "display" 106 may be another type of output device such as a laser printer or similar document view/print appliances.

According to the principles of the present invention, selected logic operations can be performed on words of data within selected locations within frame buffer 104. Specifically, these principles take advantage of the fact that during AND and OR operations a bit of data in memory being operated on either remains the same or is replaced with the corresponding bit of the modifying data provided by controller 103, depending on the state of the bit of modifying data. This feature is illustrated in Table 1:

| OPERANDS | | RESULTS | |
|---|---|---|---|
| CELL DATA | MODIFYING DATA | AND | OR |
| 0 | 0 | 0 | 0 |
| 0 | 1 | 0 | 1 |
| 1 | 0 | 0 | 1 |
| 1 | 1 | 1 | 1 |

As can be seen in Table 1, during an AND operation, the resulting data remains the same as that already stored in the selected memory cell for the input conditions set forth in the second and forth rows (i.e. the modifying data equals a logic 1). In this case, a read (refresh) of the data within the given cell operation is all that is required to perform the "modifications". This can be accomplished with a single RAS/CAS cycle with the write enable signal inactive. During an AND operation, with the input conditions set forth in the first and third rows (i.e. the modifying data is a logic 0), the resulting data is the same as the modifying data. In this case, all that is required to modify the data in the memory cell is to directly write the modifying data into the memory cell. This also can be accomplished with a single RAS/CAS cycle, only this time the write enable signal is active. In each case, there is no need to perform both a read and a write operation to modify the data in the memory cell. Further, as will be discussed further below in conjunction with FIG. 2, there is also no need to actually perform the AND operation; data is either simply refreshed by a read operation or written directly in as a function of the state of the corresponding bit of modifying data.

For an OR operation, the resulting data remains the same as that already stored in the selected memory cell for the input conditions set forth in the first and third rows (i.e. the modifying data equals a logic 0). Again, all that is required to "modify" the data in the cell is to perform a single RAS/CAS cycle read operation For the input conditions set forth in the second and fourth rows (i.e. the modifying data equals a logic 1), the resulting data is the same as the modifying data and therefore all that is required is for the modifying data to be written directly to the selected memory cell using a conventional single RAS/CAS write cycle. As was the case with the AND operation, the performance of an actual OR operation is not required; data is either refreshed by a read operation or the modifying data is written directly in as a function of the modifying data.

Similar principles may be followed for the modification of data within given memory cells using NAND and NOR operations. In the case of a NAND operation, the modifying data is inverted (i.e. the complement is taken) and the conditions for an OR operation are applied as discussed immediately above. For a NOR operation, the complement of the modifying data is again taken and the conditions for an AND operation applied as discussed.

FIG. 2 is a more detailed functional block diagram of frame buffer 104 according to a preferred embodiment of the present invention. A timing diagram describing the operation of the circuitry of FIG. 2 is provided in FIG. 3. Frame buffer 103 includes an array 200 of conventional dynamic random access memory (DRAM) cells arranged in M number of rows and N number of columns. Coupled to array 200 are row decoder circuitry 201, sense amplifiers 202 and column decoder circuitry 203. In the preferred embodiment, N number of sense amplifiers 202, one per each column in array 200, are provided Row decoder circuitry 201 and column decoder circuitry 203 control the access to P-cell storage locations from a selected row of array 200 in a conventional manner in response to row and column addresses latched into address latches 204 by RAS and CAS.

Frame buffer 104 also includes read/write control circuitry embodying the principles of the present invention. Data reads from addressed locations in array 200 are accomplished through read amplifiers 205 and output buffer 206 when the output enable signal is active. The write/modify circuitry includes a first data latch 207 which during a conventional write latches data to be written into array 200 and during a modify latches the modifying data. Writes and modifications are performed through write buffer 208 which includes P number of conventional write buffers for writing into each accessed P-cell location. During modification cycles, mode decoder 209 decodes the mode control data latched into a second data latch 210 to determine if an AND or OR operation (and consequently a NOR or NAND operation if complementary modification data is used) is to take place. In the preferred embodiment, latch 210 receives and holds at least two bits of data which, along with the conventional (external) write enable signal WE, determine if a conventional write or an AND or OR operation has been requested by controller 103.

In embodiments where controller 103 and frame buffer 104 have been fabricated as discrete components, frame buffer 104 also includes data pads 211 and associated TTL drivers 212 for receiving data (DQ), addresses, RAS, CAS, WE and OE signals from the controller chip.

During an AND or NOR operation write buffer 208 writes the modifying data latched into data latch 207 into the addressed memory cell when the modifying data is a logic 0. When the modifying data is a logic 1, no write is performed and instead a read takes place (as is known in the art a read operation refreshes the existing data stored in a given accessed memory cell, whatever the state). During an OR or NAND operation, write buffer 208 writes the modifying data latched to data latch 207 into the addressed memory cell when the modifying data is a logic 1; a read occurs when the modifying data is a logic zero. In each case, the modifying of data is controlled by enabling or disabling write buffer 209.

FIG. 4 is a logic diagram of preferred circuitry 400 for enabling or disabling write buffer 209 in order to perform the cell data modifications described above. Preferably, this circuitry is located within write buffer 209 along with the write buffers themselves, although in alternate embodiments circuitry 400 may be disposed elsewhere within the chip. Circuitry 400 generates an "internal write enable" signal which enables/disables write buffer 208 during data modification operations. The internal write enable signal is derived from the conventional write enable signal generated by controller 103 for a conventional write, control signals MODE_AND and MODE_OR, and the modifying data. In the preferred embodiment, circuitry 400 is replicated P number of times such that each of P number of bits accessed in array 200 during a single address cycle can be independently modified. To independently modify P number of bits simultaneously, controller 103 correspondingly generates P number of bits of modifying data which are latched into latch 207.

Control signals MODE_AND and MODE_OR are generated by decoder circuitry 209 from a control word (opcode) latched into data latch 210. Assuming a modification is requested, by controller 103, the external write enable signal is active (i.e. high). When MODE_AND is high and MODE_OR is low, an AND operation is selected and the internal write enable signal is active (high) when the modifying data is a logic 0. When bit MODE_AND is low and bit MODE_OR is high, an OR operation is selected and the internal write enable signal is active (high) when the modifying data is a logic 1. For a conventional write, MODE_AND and MODE_OR are inactive (low) such that the internal write enable signal simply tracks the external write enable signal.

In the case of a NAND operation, the complement of the modifying data is taken and the OR mode is selected. In the case of a NOR operation, the complement of the modifying data is taken and the AND mode is applied. It should be noted that most controllers, such as controller 103, advantageously simultaneously generate complementary data for use in other operations.

The timing diagram of FIG. 3 illustrates the timing of a given modifying operation. On the falling edge of the row address strobe (RAS), the mode select data is latched into data latch 201. The falling edge of RAS also latches the row address for the selected location in array 200 into address latch 204. The column portion of the address is latched into address latch 204 on the falling edge of the column address strobe (CAS), When the column address strobe (CAS) and the external enable signal both go low, the modifying data is latched into data latch 207. The data within data latch 210 is decoded by mode decoder 209 and presented as MODE_AND and MODE_OR to the circuitry shown in FIG. 4, as is the modifying data within data latch 207 and the external write enable signal The modification of the addressed cell or cells (depending on the number of cells P in each address location) proceeds as above.

FIG. 5 depicts an alternate embodiment of the principles of the present invention. For an AND operation, this circuit takes advantage of the fact that if the modifying data is a logic 1, then the data in each memory cell stays the same and if the modifying data is a logic 0, the data in each memory cell is always a logic 0. For an OR operation, this circuit takes advantage of the fact that if the modifying data is a logic 1, the data in each cell will always be logic 1 and if the modifying data is a logic 0, the data in each cell remains the same.

In FIG. 5, a basic latching type sense amplifier 400 is depicted for reference. It should be recognized that the principles of the present invention also apply to many other types of latching sense amplifiers known in the art. Two additional transistors 401 and 402 are provided for directly controlling the voltage at nodes 1 and 2 is response to control signals CNTRL1 and CNTRL2 respectively. Control signal CNTRL1 is generated from MODE_AND and the modifying data by inverter 403, NAND gate 404 and inverter 405. Control signal CNTRL2 is generated from MODE_OR and the modifying data by NAND gate 406 and inverter 407. In a typically application, all the sense amplifiers 202 would be controlled as shown in FIG. 5 such that an entire row of cells in array 200 would be modified at one time (i.e. each sense amplifier is associated with a pair of controlling transistors 401 and 402, although only one set of control gates 403–407 are required).

The timing for logic operations using the embodiment of FIG. 5 are shown in FIG. 6. With the falling edge of RAS, a mode select word is latched into latch 210. At the same time, a bit of modifying data is latched into latch 207. After some circuit delay, the modification, discussed further below, is effected. The modified data may then be read out if desired when CAS goes low (in this case, CAS operates as an enable signal allowing access to the data from the selected columns along the selected row).

During an AND operation, control signal MODE_AND is set high. When the modifying data is a logic 0, control signal CNTRL1 goes high and transistor 401 turns on pulling down the true bitline BT. A logic 0 is thereby written into the corresponding memory cell. When the modifying data is a logic 1, the data latched into sense amplifier 400 remains the same. By taking the complement of the modifying data, a NOR operation can similarly be implemented.

During an OR operation, control signal MODE_OR is set high. When the modifying data is a logic 1, control signal CNTRL2 goes high and transistor 402 turns on pulling down the complementary bitline BC (consequently, the true bitline BT is pulled up). A logic 0 is thereby written into the corresponding memory cell. When the modifying data is a logic 0, the data latched in sense amplifier 400 remains the same. By taking the complement of the modifying data, a NAND operation can similarly be implemented.

Although the present invention and its advantages have been described in detail, it should be understood that various changes, substitutions and alterations can be made herein without departing from the spirit and scope of the invention as defined by the appended claims.

What is claimed is:

1. A memory system comprising:

an array of memory cells arranged in rows and columns;

circuitry for selectively performing logic operations on a bit of data stored in a selected said cell using a bit of received modifying data and a mode data bit for selecting a logic operation for performance, said circuitry for modifying during an OR logic operation writing said bit of modifying data into said cell when said bit of modifying data is a logic one and maintaining an existing bit stored in said cell when said bit of modifying data is a logic zero and during an AND operation writing said bit of modifying data into said cell when said bit of modifying data is a logic zero and maintaining said bit stored in said cell when said bit of modifying data is a logic one; and circuitry for receiving and latching said mode data and said modifying data through a single port.

2. The memory system of claim 1 wherein said circuitry for selectively performing logic operations comprises:

row and column decoder circuitry for accessing said selected cell;

a write buffer for selectively writing said bit of modifying data into said selected cell in response to a write enable signal; and circuitry for generating said write enable signal when said bit of modifying data is a logic one during said OR operation.

3. The memory system of claim 1 wherein said circuitry for selectively performing logic operations comprises:

row and column decoder circuitry for accessing said selected cell;

a write buffer for selectively writing said bit of modifying data into said selected cell in response to a write enable signal;

circuitry for generating a said write enable signal when said bit of modifying data is a logic one during an OR operation and a logic zero during an AND operation.

4. The memory system of claim 3 wherein said circuitry for generating comprises:

a first inverter having an input for receiving an OR mode control signal, said OR mode control signal set to a logic 1 during an OR operation;

a second inverter having an input for receiving an AND mode control signal, said AND mode control signal set to a logic 1 during an AND operation;

a first NAND gate having a first input coupled to an output of said first inverter, a second input coupled to an output of said second inverter, and a third input for receiving an external write enable signal;

a second NAND gate having a first input coupled to said output of said first inverter and a second input for receiving said bit of modifying data;

a third NAND gate having a first input coupled to an output of said second NAND gate and a second input for receiving said external write enable signal;

a fourth NAND gate having a first input for receiving said AND mode control signal and a second input for receiving said bit of modifying data;

a fifth NAND gate having a first input coupled to an output f said fourth NAND gate and a second input for receiving said external write enable signal; and a sixth NAND gate having a first input coupled to an output of said first NAND gate, a second input coupled to an output of said third NAND gate, and a third input coupled to an output of said fifth NAND gate, said sixth NAND gate selectively outputting said write enable signal for enabling said write buffer in response to said mode control signals, said external write enable signals, and said bit of modifying data.

5. A method of performing logic operations on data stored within a memory comprising the steps of:

addressing at least one memory cell in the memory containing data to be modified;

receiving a bit of modifying data and a mode data bit;

selectively performing an OR operation in response to the mode data bit comprising the substeps of:

writing the bit of modifying data into the addressed cell when the bit of modifying data is a logic one; and
maintaining the data stored in the addressed cell when the bit of modifying data is a logic zero; and
selectively performing an AND operation in response to the mode data bit comprising the substeps of:
writing said bit of modifying data into said cell when said bit of modifying data is a logic zero; and
maintaining said bit stored in said cell when said bit of modifying data is a logic one.

6. The method of claim 5 and further comprising the step of taking the complement of the bit of modifying data to effectuate a NAND operation during said step of performing.

* * * * *